(12) United States Patent
Jordan

(10) Patent No.: US 11,579,210 B1
(45) Date of Patent: Feb. 14, 2023

(54) MAGNETIC SENSOR OFFSET DETECTION

(71) Applicant: Amazon Technologies, Inc., Seattle, WA (US)

(72) Inventor: Ian Jordan, Lake Forest Park, WA (US)

(73) Assignee: Amazon Technologies, Inc., Seattle, WA (US)

(\*) Notice: Subject to any disclaimer, the term of this patent is extended or adjusted under 35 U.S.C. 154(b) by 1003 days.

(21) Appl. No.: 16/263,828

(22) Filed: Jan. 31, 2019

(51) Int. Cl.
| | |
|---|---|
| *G01R 33/00* | (2006.01) |
| *G01C 21/08* | (2006.01) |
| *G01C 17/38* | (2006.01) |
| *G01R 33/02* | (2006.01) |
| *B64C 39/02* | (2023.01) |
| *G01C 17/28* | (2006.01) |

(52) U.S. Cl.
CPC ........ *G01R 33/0017* (2013.01); *B64C 39/024* (2013.01); *G01C 17/28* (2013.01); *G01C 17/38* (2013.01); *G01C 21/08* (2013.01); *G01R 33/0094* (2013.01); *G01R 33/0206* (2013.01); *B64C 2201/141* (2013.01)

(58) Field of Classification Search
CPC ............ G01R 33/0017; G01R 33/0094; G01R 33/0206; B64C 39/024; B64C 2201/141; G01C 17/28; G01C 17/38; G01C 21/08
See application file for complete search history.

(56) References Cited

U.S. PATENT DOCUMENTS

| | | | | |
|---|---|---|---|---|
| 2014/0136414 | A1* | 5/2014 | Abhyanker | G05D 1/0011 |
| | | | | 701/25 |
| 2014/0361763 | A1* | 12/2014 | Chow | G01R 33/02 |
| | | | | 324/202 |
| 2016/0146903 | A1* | 5/2016 | Yang | G01R 33/022 |
| | | | | 324/244 |
| 2021/0141044 | A1* | 5/2021 | Carter | G01R 35/005 |

\* cited by examiner

*Primary Examiner* — Son T Le
*Assistant Examiner* — Adam S Clarke
(74) *Attorney, Agent, or Firm* — Lowenstein Sandler LLP

(57) ABSTRACT

A digital compass with two or more multi-axis magnetometers and a processing element to determine a heading and detect any offset error in the heading is described. One electronic device includes first and second magnetometers. The second magnetometer can be disposed at least a specified distance or co-located and offset at least a specified angle from the first magnetometer. A processing device determines a magnetic field at the electronic device using a first output from the first magnetometer, detects an offset error in the magnetic field using a second output from the second magnetometer, and reports the offset error in the magnetic field.

19 Claims, 10 Drawing Sheets

MAGNETIC SENSOR OFFSET DETECTION

BACKGROUND

Magnetometers are instruments that measure the local magnetic field strength. Digital compasses combine multiple magnetometers to measure the direction of an ambient magnetic field. The measured magnetic field is an absolute magnetic intensity which at least includes the Earth's magnetic field at that particular location. The absolute magnetic field measured at a particular location will also include magnetic fields caused by other magnetic objects or magnetic material. As such, calibration of magnetometers is performed to remove these local effects, but this calibration only remains valid as long as the local magnetic environment does not change and the magnetometer itself does not change its response to magnetic fields.

BRIEF DESCRIPTION OF DRAWINGS

The present disclosure will be understood more fully from the detailed description given below and from the accompanying drawings of various embodiments, which, however, should not be taken to limit the present disclosure to the specific embodiments, but are for explanation and understanding only.

DETAILED DESCRIPTION

Figure 1:
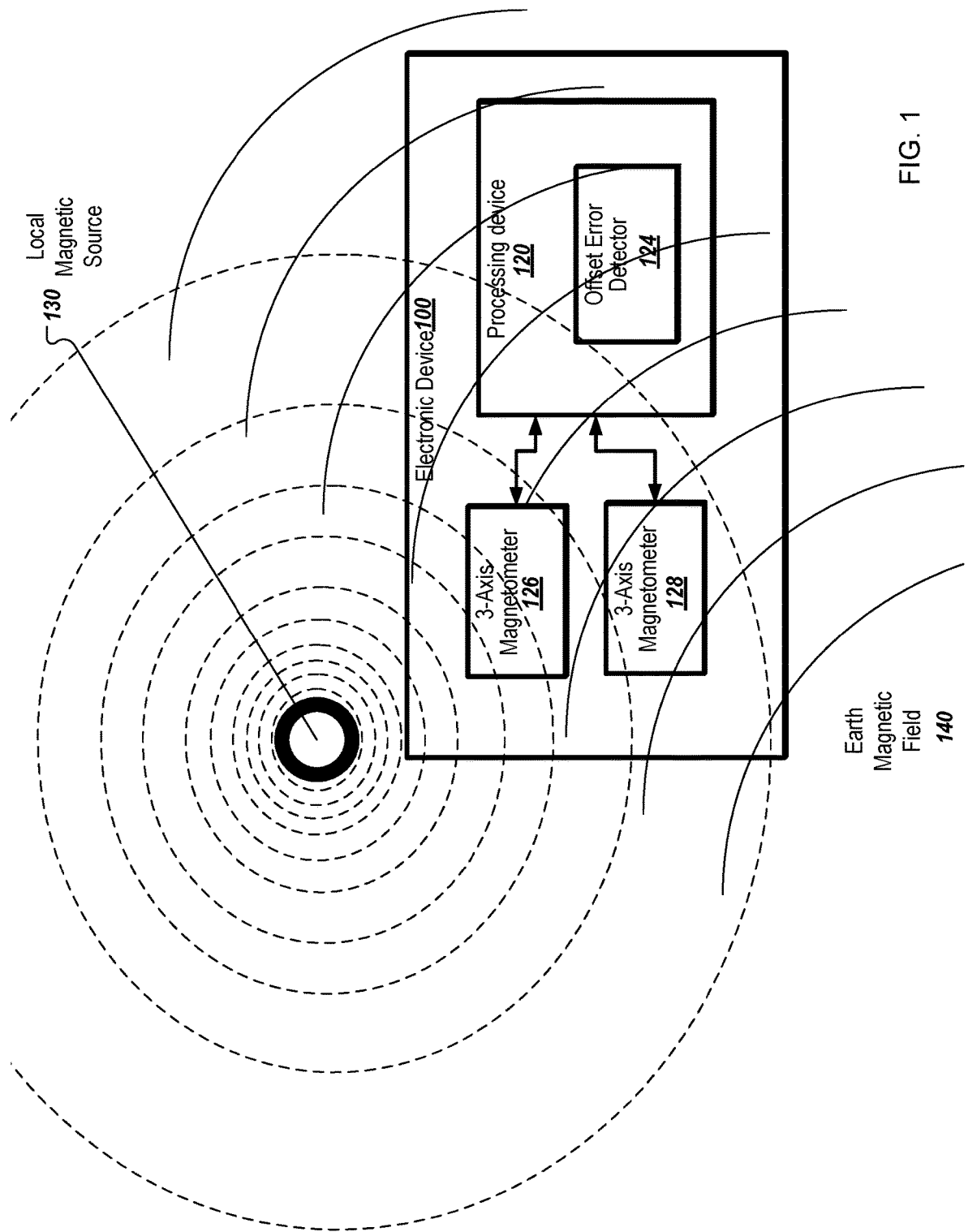
FIG. 1 is a block diagram of an electronic device with two three-axis magnetometers and a processing device with an offset error detector according to one embodiment.

A digital compass with two or more multi-axis magnetometers and a processing element to determine a heading and detect any offset error in the heading is described. The offset causes the digital compass to read an incorrect heading, which is generally not detectable. As described above, the presence of a local magnetic field affects measurements by a magnetometer. The local magnetic field can cause an offset error in a heading when the local magnetic field is close enough to the magnetometer of a digital compass. Global positioning system (GPS) technologies can be used to determine heading, but requires movement of a device over time and requires that the device can receive GPS signals that do not carry well through covered structures. A conventional magnetometer cannot distinguish between magnetic fields caused by the earth and magnetic fields caused by other sources. When the magnetic field measured includes both the earth's magnetic field and local magnetic fields, the heading measured by the magnetometer can be incorrect and is said to have an offset error.

For example, in cases where the digital compass is used in connection with a delivery drone, a product item placed in a delivery container of the delivery drone can introduce a local magnetic field that causes an offset error in the heading. For example, the product could include a speaker with a magnet. The presence of the speaker can introduce a local magnetic field that impacts current operations of the magnetometer of the digital compass. Some offset errors can prevent successful transportation of the product via the delivery drone.

When a conventional digital compass is operating and a local magnetic field is introduced in proximity to the magnetometer of the convention digital compass, the offset error can be detected in some cases. However, there are some local magnetic fields that can permanently affect the magnetometer such that it causes a permanent offset error that can not be detected. In some cases, the permanent offset is unknown since the magnetometer can be exposed to a large magnetic field when the device is not operating. That is, the magnetic field exposure may occur when the sensor is off and cannot be detected by processing signals from the sensor. The offset errors are not exclusively caused by large magnetic fields, but they can also be caused by temperature, time, or sensor failures. When the device turns on again and measures heading, the heading will have a permanent offset error that can go undetected. For example, a calibrated digital compass (also referred to as an electronic compass module) can measure the magnetic field as 1 gauss, but the exposure to the large local magnetic field while the digital compass was off can cause the magnetometer to measure the magnetic field as 1.1 gauss, reflecting a permanent offset of 0.1. The problem, however, is that the magnetometer is presumed to have not changed since calibration. The permanent offset error of 0.1 causes the heading to be incorrect. An undetected offset error can impact the heading, potentially resulting in navigation errors of a vehicle that relies on the heading or potentially reporting an incorrect heading to a user of the digital compass. In some cases, when a magnetic device is on a vehicle and causes an error in the magnetic field, the on-board magnetic field causes an error in the heading reading as the earth and local (secondary) magnetic fields sum in a way that cannot be detected by the sensor. In some cases, the navigation errors are minor, but in other cases, the navigation errors could prevent reliable operation of the vehicle. In the various cases, the errors can be calibrated out using well known calibration techniques. However, the calibration is static and assumes the error does not change or has not changed since the last calibration. There is no conventional way to know when this calibration needs to be run again when it becomes invalid due to sensor changes caused by a local magnetic field. Although there are techniques to calibrate the conventional magnetometer to compensate for offset errors, when the offset error is unknown, the device or a user of the device does not know that the magnetometer needs to be recalibrated for determining a correct heading, preventing flight of the vehicle, or the like.

Aspects of the present disclosure address the above and other deficiencies by using at least a second magnetometer to at least detect an offset error in a first magnetometer of a device. In some cases, the two or more magnetometers can be implemented in a digital compass that computes a heading. The multiple magnetometers can be placed a minimum specified distance apart from one another, with a minimum specified angle relative to each other's orientation, or as different types (manufactured by different techniques) of magnetometers. The embodiments described herein leverage that fact that a local magnetic field affects the magnetometers differently. The multiple magnetometers can be calibrated and, by subsequently measuring one or more differences between the multiple magnetometers, an offset error can be detected. The multiple magnetometers can be calibrated once installed in a vehicle. These magnetometers can be installed in a known and trusted magnetic environment. Once the offset error is detected after calibration, it can be reported or output to initiate a calibration or re-calibration of the magnetometers. The offset error, when determined to meet a threshold criteria, could prevent starting navigation of a vehicle that relies on a heading computed by the magnetometers. For example, a first magnetometer can be a three-axis magnetometer and a second magnetometer can include at least one axis that is offset in distance or angle from at least one of the three axes of the three-axis magnetometer. The local magnetic field affects the at least one axis is differently from the three-axis magnetometer. If the multiple magnetometers no longer match, the offset error is detected. A heading computed from the measured magnetic field can be determined as untrustworthy. For more accuracy in detecting an offset error, the second magnetometer can also be a second three-axis magnetometer that is offset in distance or orientation relative to the first three-axis magnetometer. In some embodiments, a third magnetometer can be used to identify a location of a source of the local magnetic field, a magnitude of the local magnetic field to determine a magnitude of the offset error in order to compensate for the offset error.

In some cases, by installing two sensors with physical distance between them, two functions are enabled. If a strong external magnetic field is applied to a vehicle, the two sensors will be exposed to different field strengths due to the fact that magnetic fields fall off by a cube of the distance. When the sensors are next used, a process can detect that the two sensors no longer match one another and flag an error, preventing use of a device which is out of calibration. The process can also be used to detect changes in the magnetic field created by a vehicle or a payload carried by the vehicle. Again, using the fact that the magnetic fields fall off by the cube of the distance between sensors, a nearby magnetic field affects the sensors differently. The earth's magnetic field, which is a much large distance, will affect the two sensors in a minimal way that is negligible. In some cases, by knowing a distance between the multiple sensors, a local magnetic field can be determined and compensated for, allowing the multiple sensors to respond only to the earth's magnetic field. This can allow the use of the sensors without requiring offline calibration.

In other cases, by installing two sensors in close proximity and orienting these sensors differently from one another, such as by placing the sensors on opposite sides of a printed circuit board (PCB), rotating one of the sensors by a specified angle (e.g., 45 degrees), the multiple sensors will experience different field vectors when exposed to a strong field. They will thus get a different offset that can be compared when the sensors are used next. As such, the aspects of the present disclosure can be expanded to use in a design with two or more sensors of different characteristics that are known to react differently to strong local magnetic fields.

Accordingly, aspects of the present disclosure can provide various advantages over the conventional magnetometers or conventional digital compasses. For example, the aspects of the present disclosure can detect an offset error, including temporary offset errors or permanent offset errors caused by a local magnetic field. In some cases, the aspects of the present disclosure can determine a magnitude of the offset error and compensate for the offset error. The aspects of the present disclosure can be implemented in a vehicle and used to check that there is no change (i.e., no offset error detected) since a last calibration, reducing a number of times the vehicle needs calibration before a trip. For example, in cases where heading is very important, like for aerial flight, calibration of a digital compass may be needed every flight. Using the aspects of the present disclosure, re-calibration of the digital compass can be reduced or eliminated when there is no change since the last calibration.

FIG. 1 is a block diagram of an electronic device 100 with two three-axis magnetometers and a processing device 120 with an offset error detector 124 according to one embodiment. The processing device 120 is coupled to a first three-axis magnetometer 126 and a second three-axis magnetometer 128. The processing device 120 can be coupled to additional 3-axis magnetometers as described herein. The first three-axis magnetometer 126 and the second three-axis magnetometer 128 can have different characteristics, including different placement, different orientation, different sensing technologies, different manufacturing, or other characteristics that are known to react differently to strong local magnetic fields. The offset error detector 124 can comprises hardware, software, firmware, or any combination thereof. In one embodiment, the offset error detector 124 obtains first data from the first three-axis magnetometer 126, obtains second data from the second three-axis magnetometer 128, and determines a difference between the first data and the second data. In some cases, the first data (and the second data) is indicative of a heading of a vehicle in which the electronic device 100 permanently or temporarily resides. The offset error detector 124 can determine that the difference between the first data and the second data satisfies a threshold criterion. The threshold criterion can correspond to detecting an offset error in the heading caused by at least one of a permanent offset error or a local temporary offset error in the heading. The offset error detector 124 can output, report, or otherwise flag an offset error detected between the first three-axis magnetometer 126 and the second three-axis magnetometer 128 responsive to the difference satisfying the threshold criterion. In the case of use in a vehicle, the offset error detector 124 can output, report, or otherwise flag an offset error in a heading of the vehicle responsive to the difference satisfying the threshold criterion. The offset error detector 124 can operate according to the various processes described herein.

As illustrated in FIG. 1, the first three-axis magnetometer 126, the second three-axis magnetometer 128 are exposed to the earth's magnetic field 140. The presence of a local magnetic source 130 creates a local magnetic field that affects the first three-axis magnetometer 126 and the second three-axis magnetometer 128 differently. For example, the first three-axis magnetometer 126 can be closer in proximity to the local magnetic source so the local magnetic field is stronger at the first three-axis magnetometer than relative to the second three-axis magnetometer 128. When the local magnetic field is large enough, there can be an offset error between the first three-axis magnetometer 126 and the second three-axis magnetometer 128 due to the difference in position. For example, the first three-axis magnetometer 126 can be disposed at a first location on a circuit board and the second three-axis magnetometer 128 can be disposed at a second location on the circuit board, such as a specified minimum distance of approximately 1 centimeter (cm). In another embodiment, the first three-axis magnetometer 126 and the second three-axis magnetometer 128 can be disposed at a same location, but the second three-axis magnetometer 128 can be oriented differently than the first three-axis magnetometer 126, affecting the offset errors of the respective sensors differently. The difference between the first three-axis magnetometer 126 and the second three-axis magnetometer 128 can be detected as an offset error by the offset error detector 124 and the offset error detector 124 can report the offset error when the first three-axis magnetometer 126 and the second three-axis magnetometer 128 do not match. In some cases, the offset error detector 124 can compare a first absolute magnetic field detected by the first three-axis magnetometer 126 and a second absolute magnetic field detected by the second three-axis magnetometer 128. The difference between the absolute magnetic fields can be reported as an offset error when the difference satisfies a threshold criterion. The threshold criterion can be set that the absolute magnetic fields have to match or be within a specified range of one another.

In one embodiment, the first three-axis magnetometer 126, the second three-axis magnetometer 128, and the processing device 120 with the offset error detector 124 can be implemented in a digital compass that calculates a heading of the electronic device 100. The processing device 120 can determine a heading from at least one of the first data or the second data and output the heading to a display (not illustrated in FIG. 1) associated with the processing device 120. The processing device 120 can prevent the heading from being output to the display or output an indicator that the heading is invalid to the display responsive to the difference satisfying the threshold criterion.

In one embodiment, the first data from the first three-axis magnetometer 126 includes a first digital heading value and the second data from the second three-axis magnetometer 128 includes a second digital heading value. The headings can be represented in various formats, including a 3D vector pointing to a strongest magnetic field, a transformation from 2D Cartesian coordinates into 2D polar coordinates (radius, angle), a 3D version of polar coordinates or spherical coordinates. In another embodiment, the first data includes a first value corresponding to a first axis of the first three-axis magnetometer 126, a second value corresponding to a second axis of the first three-axis magnetometer 126, and a third value corresponding to a third axis of the first three-axis magnetometer 126. The second data includes a fourth value corresponding to a first axis of the second three-axis magnetometer 128, a fifth value corresponding to a second axis of the second three-axis magnetometer 128, and a sixth value corresponding to a third axis of the second three-axis magnetometer 128. The processing device 120, to determine the difference between the first data and the second data, can compare the first value and the fourth value, the second value and the fifth value, the third value and the sixth value, or any combination thereof. Individual axis threshold criteria can be defined for any one or more of the three axes. Alternatively, collective headings can be determined from the three values, respectively, and the collective headings can be compared to determine the difference.

In one embodiment, the first three-axis magnetometer 126 includes a magnetic field sensor in each of the three axes. For example, the first three-axis magnetometer 126 includes an X-sensor, a Y-sensor, and a Z-sensor corresponding to the three axes of the electronic device 100. The second three-axis magnetometer 128 includes a magnetic field sensor in each of the three axes. For example, the first three-axis magnetometer 126 includes an X2-sensor, a Y2-sensor, and a Z2-sensor corresponding to the three axes of the electronic device 100. In another embodiment, the second three-axis magnetometer 128 includes a magnetic field sensor in three axes that are offset from the three axes of the first three-axis magnetometer 126. For example, the first three-axis magnetometer 126 includes a U-sensor, a V-sensor, and a W-sensor corresponding to the three offset axes of the electronic device 100. The offset axes, for example, can be offset by 45 degrees from the three axes of the first three-axis magnetometer 126.

Although illustrated as having two three-axis magnetometers in FIG. 1, in another embodiment, the electronic device 100 includes a first magnetometer with a first magnetic field sensor corresponding to a first axis of the electronic device 100 and a second magnetic field sensor corresponding to a second axis of the electronic device 100. The first axis and the second axis can be orthogonal. The electronic device 100 also includes a second magnetometer with a fourth magnetic field sensor corresponding to the first axis and a fifth magnetic field sensor corresponding to the second axis of the electronic device 100. The second magnetometer can be disposed at least a specified minimum distance of approximately 1 centimeter away from the first magnetometer. The processing device 120 can determine a magnetic field at the electronic device 100 using a first output from the first magnetometer and can detect an offset error in the magnetic field using a second output from the second magnetometer. The processing device 120 can report the offset error in the magnetic field, such as by a log, an indicator on a display, a message, or other outputs. The first output can be indicative of a heading in two-dimensional space, such as for a vehicle traveling along the ground. Alternatively, the magnetometers can include additional magnetic field sensors. For example, in a further embodiment, the first magnetometer can include a third magnetic field sensor corresponding to a third axis of the electronic device 100 and the second magnetometer can include a sixth magnetic field sensor corresponding to the third axis. The first axis, the second axis, and the third axis can be orthogonal. The first output can be indicative of a heading in three-dimensional space.

The processing device 120 can determine the heading using the first output, the second output, or any combination thereof. The processing device 120 can determine a difference between the first output and the second output and detect the offset error in the heading using the difference.

Although illustrated as having two three-axis magnetometers in FIG. 1, in another embodiment, the electronic device 100 can include more magnetometers. For example, in one embodiment, the electronic device 100 further includes a third magnetometer with a seventh magnetic field sensor corresponding to the first axis, an eighth magnetic field sensor corresponding to the second axis, and a ninth magnetic field sensor corresponding to the third axis. The third magnetometer can be disposed at least the specified minimum distance of approximately 1 centimeter away from the first magnetometer and at least the specified minimum distance of approximately 1 centimeter away from the second magnetometer. The processing device 120 can determine the heading of the electronic device 100 using at least one of the first output, the second output, or a third output from the third magnetometer. The processing device 120 detects the offset error in the heading using at least a first difference between the first output and the second output, a second difference between the first output and the third output, a third difference between the second output and the third output, or any combination thereof. The processing device 120 can determine a local magnetic field introduced by a magnetic source in proximity to at least one the first magnetometer, the second magnetometer, or the third magnetometer. The processing device 120 can calculate an offset for at least one of the first magnetometer, the second magnetometer, or the third magnetometer and apply the offset to the at least one of the first magnetometer, the second magnetometer, or the third magnetometer. The processing device 120 can determine an updated heading of the electronic device 100 subsequent to the offset being applied. As described herein, the offset error can be a permanent offset error or a temporary offset error.

In another embodiment, the electronic device 100 can include a first magnetometer with a first magnetic field sensor in a first axis, a second magnetic field sensor in a second axis, and a third magnetic field sensor in a third axis. The first axis, the second axis, and the third axis can be orthogonal. The first magnetometer and the second magnetometer can be co-located or located in separate locations, such as disposed at least a specified minimum distance of approximately 1 centimeter away from one another. The electronic device 100 also includes a second magnetometer with at least an additional magnetic field sensor positioned in at least one of a fourth axis that is non-orthogonal axis to the first axis, the second axis, and the third axis or oriented in a non-identical orientation as the first magnetic field sensor in the first axis, the second magnetic field sensor in the second axis, or the third magnetic field sensor in the third axis. That is, the additional magnetic field sensor can be located on the same axis as any one of the other magnetic field sensors, but with a different orientation. Two magnetic field sensors positioned on the same axis but with opposite orientations would react differently to local magnetic fields. The processing device 120 can determine a magnetic field at the electronic device 100 using a first output from the first magnetometer. The processing device 120 can detect an offset error in the magnetic field using a second output from the second magnetometer and report the offset error in the magnetic field.

In a further embodiment, the second magnetometer further includes a fifth magnetic field sensor in a fifth axis that is non-orthogonal axis to the first axis, the second axis, and the third axis. The first output and the second output are indicative of a heading of the electronic device 100 in two-dimensional space. The processing device 120 can determine the heading of the electronic device using the first output, the second output, or any combination thereof. The processing device 120 can determine a difference between the first output and the second output and detect the offset error in the heading using the difference.

In another embodiment, the second magnetometer further includes a sixth magnetic field sensor in a sixth axis that is non-orthogonal axis to the first axis, the second axis, and the third axis. The first output and the second output are indicative of a heading of the electronic device 100 in three-dimensional space, The processing device 120 can determine the heading of the electronic device 100 using the first output and the second output, determine a difference between the first output and the second output, and detect the offset error in the heading using the difference.

In a further embodiment, the electronic device 100 further includes a third magnetometer is disposed at least the specified minimum distance of approximately 1 centimeter away from the first magnetometer and at least the specified minimum distance of approximately 1 centimeter away from the second magnetometer. The processing device 120 determines the heading of the electronic device using at least one of the first output, the second output, a third output from the third magnetometer, or any combination thereof. The processing device 120 detects the offset error in the heading using at least a first difference between the first output and the second output, a second difference between the first output and the third output, a third difference between the second output and the third output, or any combination thereof. The processing device 120 can determine a local magnetic field introduced by a magnetic source in proximity to the first magnetometer, the second magnetometer, and/or the third magnetometer. The processing device 120 can calculate an offset for at least one of the first magnetometer, the second magnetometer, and the third magnetometer and apply the offset to the at least one of the first magnetometer, the second magnetometer, and the third magnetometer. The processing device 120 determines an updated heading of the electronic device subsequent to the offset being applied.

In a further embodiment, the multiple magnetometers are part of a digital compass of the electronic device 100 and the electronic device 100 includes additional components, such as a host processor, a propulsion subsystem, a wireless communication subsystem, and zero or more additional sensors, each coupled to the processing device via one or more wired interconnects or wireless connections. The digital compass can be integrated or otherwise disposed in a vehicle, such as a drone, an autonomous drone, an unmanned aerial vehicle (UAV), a ground vehicle, an autonomous ground vehicle (AGV), an aerial vehicle, a high-altitude aircraft, a car, a truck, a sport utility vehicle, a watercraft, or the like.

Figure 2:
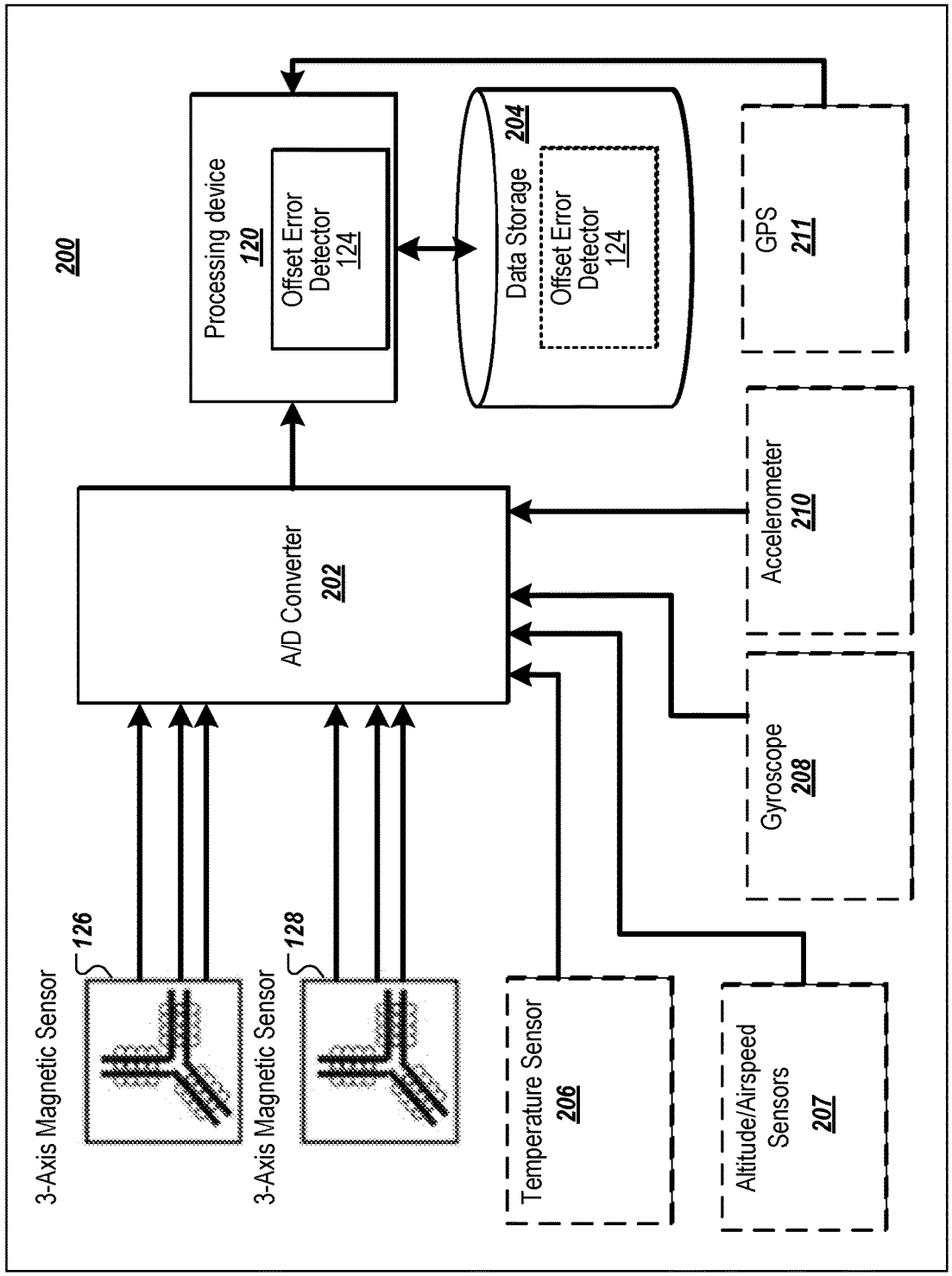
FIG. 2 is a block diagram of an electronic device with two three-axis magnetometers and a processing device with an offset error detector according to another embodiment.

FIG. 2 is a block diagram of an electronic device 200 with two three-axis magnetometers and a processing device with an offset error detector according to another embodiment. The electronic device 200 is similar to the electronic device 100 as noted by similar reference numbers. The electronic device 200 can be a navigation system. The electronic device 200 includes an analog to digital converter (ADC) 202, data storage 204, a temperature sensor 206, altitude and airspeed sensors 207, a gyroscope sensor 208, an accelerometer sensor 210, and a global positioning system (GPS) 211. The first three-axis magnetometer 126 and the second three-axis magnetometer 128 can output analog data and the ADC 202 can convert the analog data to digital data for the processing device 120. The ADC 202 can also convert analog data received from the temperature sensor 206, the altitude and airspeed sensors 207, the gyroscope sensor 208, and/or the accelerometer sensor 210. The processing device 120 can also receive data output from the GPS 211. For example, the data from the GPS 211 can be used to supplement or confirm headings calculated by the processing device 120. In some cases, the processing device 120 can use the data from one or more of the additional sensors to compute or correct the heading and the offset error detector 124 can detect the offset error in any heading calculated. The offset error detector 124 can initiate or otherwise trigger a calibration operation to be performed on the first three-axis magnetometer 126, the second three-axis magnetometer 128, or both. Alternatively, the sensors (126, 128, 206, 208, and/or 210) can output digital data that can be directly received by the processing device 120 without the ADC 202. More or less sensors than those illustrated in FIG. 2 can be included in the electronic device 200.

The processing device 120 can be coupled to the data storage 204 and the data storage 204 can store instructions of the offset error detector 124. Alternatively, the offset error detector 124 is implemented as firmware or embedded software of the processing device 120. The instructions can be part of firmware, software, or any combination thereof. The operations of the offset error detector 124 are described herein.

The components of FIG. 2 can be disposed on one or more circuit boards. In one embodiment, the components of FIG. 2 can be disposed on a single circuit board. As described herein, the first three-axis magnetometer 126 and the second three-axis magnetometer 128 can be co-located or disposed at separate locations that are separated by a specified minimum distance, e.g., 1 cm.

Figure 3:
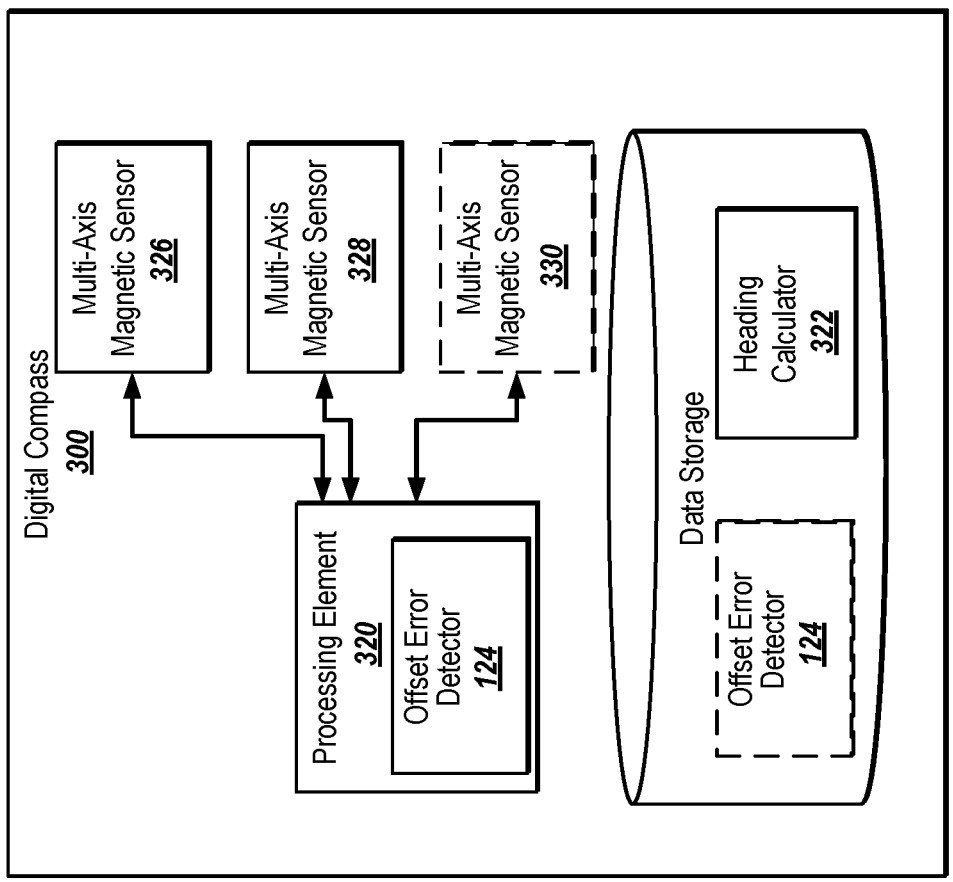
FIG. 3 is a block diagram of a digital compass with three multi-axis magnetometers and a processing element for executing an offset error detector according to one embodiment.

FIG. 3 is a block diagram of a digital compass 300 with three multi-axis magnetometers 326, 328, 330 and a processing element 320 for executing an offset error detector 124 according to one embodiment. The digital compass 300 includes at least two multi-axis magnetometers 326 and 328, but can include more magnetic sensors as illustrated by a third multi-axis magnetic sensor 330. Each of the three multi-axis magnetometers 326, 328, 330 is coupled to the processing element 320. The processing element can be a processing device, a controller, a microcontroller, a processor, or the like. The processing element 320 can execute instructions stored in the data storage 304 coupled to the processing element 320. The data storage 304 can store instructions of the offset error detector 124 and instructions of a heading calculator 322. Alternatively, the offset error detector 124 is implemented as firmware or embedded software of the processing device 120. The processing element 320 can receive data from each of the multi-axes magnetometers 326, 328, and 330. The heading calculator 322 can calculate a heading based on the data and the offset error detector 124 can detect whether an offset error satisfies a threshold criteria. When the threshold criteria is satisfied, the offset error detector 124 can report the offset error, such as by flagging the offset error, outputting an indicator on a display, storing the offset error in a report, or the like.

The three multi-axes magnetometers 326, 328, and 330 can be similar configured, located, oriented, or have similar characteristics as the magnetometers described above with respect to FIGS. 1-2. The offset error detector 124 can operate in similar manners as described above with respect to FIGS. 1-2.

Figure 4:
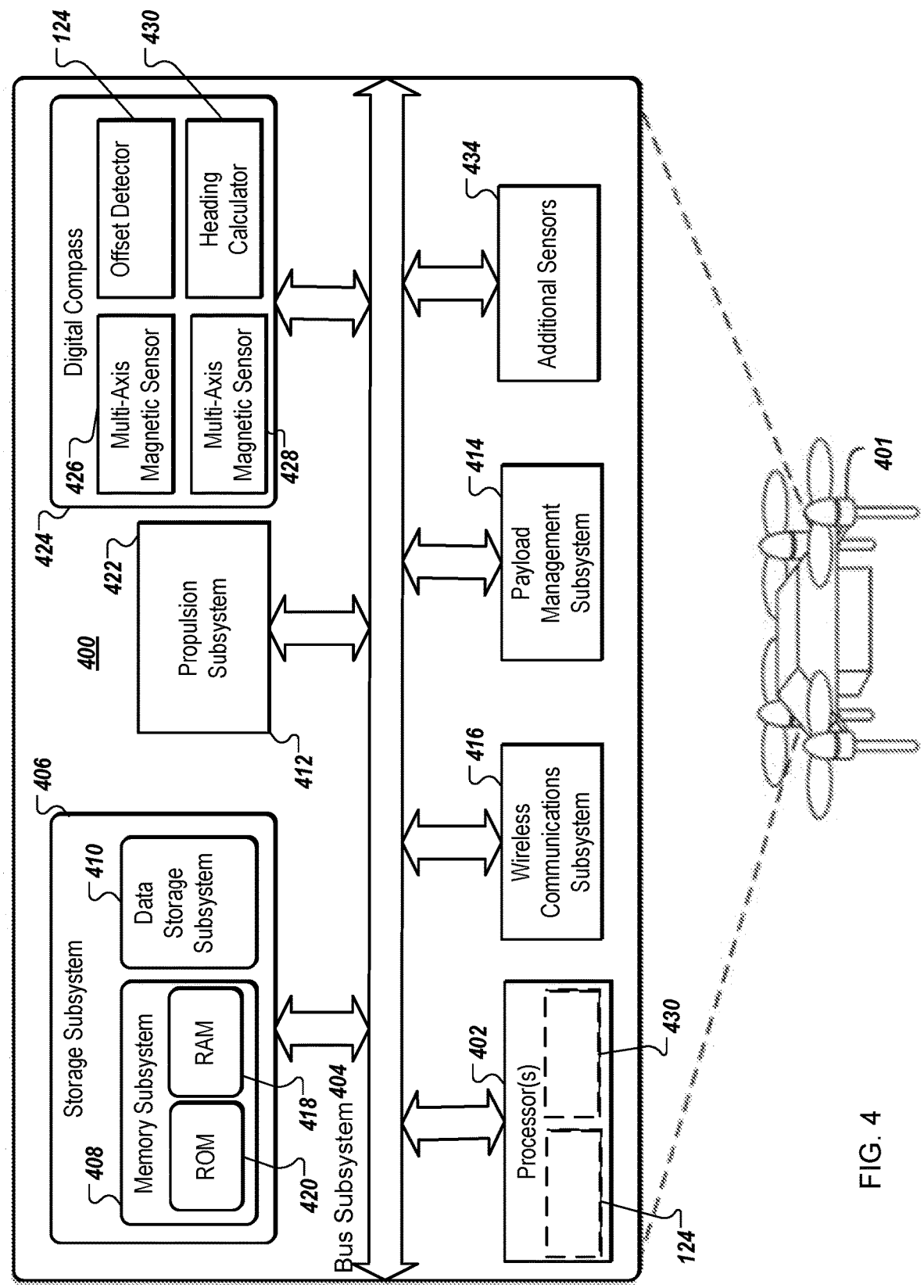
FIG. 4 is a block diagram of an on-board computer system of an unmanned aerial vehicle having a digital compass with an offset error detector that may be used to practice at least one embodiment of the present disclosure.

FIG. 4 is a block diagram of an on-board computer system 400 of an unmanned aerial vehicle 401 (e.g., delivery drone) having a digital compass 424 with an offset error detector 124 that may be used to practice at least one embodiment of the present disclosure. In various embodiments, the computer system 400 may be used to implement any of the systems illustrated herein and described above. As shown in FIG. 4, the on-board computer system 400 may include one or more processors 402 that may be configured to communicate with and are operatively coupled to a number of peripheral subsystems via a bus subsystem 404. These peripheral subsystems may include a storage subsystem 406, comprising a memory subsystem 408 and a data storage subsystem 410, a propulsion subsystem 412, a payload management subsystem 414, a wireless communication subsystem 416, a digital compass 424, comprising a first multi-axis magnetic sensor 426, a second multi-axis magnetic sensor 428, the offset error detector 124, a heading calculator 430, and a set of additional sensors 434. In another embodiment, the offset error detector 124 and the heading calculator 430 can be integrated into the processor 402 as illustrated as the hashed boxes in processor 402.

The bus subsystem 404 may provide a mechanism for enabling the various components and subsystems of computer system 400 to communicate with each other as intended. Although the bus subsystem 404 is shown schematically as a single bus, alternative embodiments of the bus subsystem may utilize multiple busses.

The wireless communications subsystem 416 may provide an interface to other computer systems and networks. The wireless communications subsystem 416 may serve as an interface for receiving data from and transmitting data to other systems from the computer system 400. For example, the wireless interface subsystem 416 may enable exchange of messages and other related information. In an embodiment, the wireless communications subsystem 416 uses the long-term evolution (LTE) standard to communicate with other wireless communications subsystems of other unmanned aerial vehicles, although the scope of the present disclosure includes wireless communications using any suitable standard and/or protocol. In some examples, the wireless communications subsystem 416 communicates using the carrier sense multiple access with collision avoidance (CSMA/CA) protocol or another suitable protocol. The wireless communications subsystem 416 may also facilitate the receipt and/or transmission of data on multiple networks, such as by transmitting some data directly to other unmanned aerial vehicles and transmitting other data through a cellular network.

The propulsion subsystem 412 may include various components that propel the unmanned aerial vehicle 401 and that control the propulsion of the unmanned aerial vehicle. For example, the propulsion subsystem 412 may include a plurality of motors, each with a propeller, and a controller for the motors that controls the individual rotational velocity of each propeller so as to control the unmanned aerial vehicle's speed, altitude, direction, pitch, roll, yaw, and, the flight dynamics of the unmanned aerial vehicle. The propulsion subsystem 412 may control other components (e.g., rudders, flaps, and other components that may affect the aerodynamics of the unmanned aerial vehicle) if the unmanned aerial vehicle is so equipped. While FIG. 4 shows a helicopter-style unmanned aerial vehicle, other unmanned aerial vehicles, such as noted above and, generally, any unmanned vehicle configured to travel on land, on sea, in sea, through air, and/or in space is considered as within the scope of the present disclosure and the specific mechanisms used for propulsion may vary in accordance with different embodiments.

The payload management subsystem 414 may be a set of components of the computer system 400 configured for the management of a payload of the unmanned aerial vehicle 401. For example, the payload management subsystem 414 may control a cargo bay that opens and closes to drop a payload delivered by the unmanned aerial vehicle 401. In some examples, an unmanned aerial vehicle has multiple cargo bays that can be used to selectively deliver one of many payloads. Generally, the payload management subsystem 414 may control one or more electrical and/or mechanical systems that enable the unmanned aerial vehicle to release a payload from the control of the unmanned aerial vehicle. The payload management subsystem 414 may also include various mechanisms (e.g., hooks, magnets, claws, and the like) for retrieving payloads and loading into a cargo bay of the unmanned aerial vehicle or otherwise for bringing a payload into the control of the unmanned aerial vehicle. As such, the payload management subsystem 414 may include a controller for one or more mechanisms (e.g., actuators or latches) that are used to open and close any cargo bays of the unmanned aerial vehicle or otherwise control one or more payloads. Generally, the payload management system may perform other functions dependent on the specific configuration of the unmanned aerial vehicle 401. For example, the payload management subsystem may be configured to deliver payloads in other ways in addition to or instead of opening cargo bays (e.g., by lowering a payload by a cable). The payload management subsystem 114 may perform more advanced functions, such as shifting payloads to improve flight characteristics, picking up payloads, and, generally, performing other functions that the unmanned aerial vehicle may be configured to perform. In other embodiments, the payload management system 114 may simply include a product container to store a product for delivery by the vehicle.

The storage subsystem 406 may provide a computer-readable storage medium for storing the basic programming and data constructs that may provide the functionality of at least one embodiment of the present disclosure. The applications (programs, code modules (i.e., programming modules), instructions) that, when executed by one or more processors, may provide the functionality of one or more embodiments of the present disclosure, may be stored in the storage subsystem 406. These application modules or instructions may be executed by the one or more processors 402. The storage subsystem 406 may additionally provide a repository for storing data used in accordance with the present disclosure. The storage subsystem 406 may comprise a memory subsystem 408 and a data (e.g., file/disk) storage subsystem 410 (e.g., for storing messages received, logs, and/or other information). The offset detector 124 and the heading calculator 430 can be instructions stored in a data store of the digital compass 424 or in the storage subsystem 406.

As illustrated in FIG. 4, the unmanned aerial vehicle's on-board computer system 400 may include a set of sensors 434 that gather data utilized by the various components of the on-board computer system. For instance, the sensors 434 may include an altimeter that is used by the propulsion subsystem 412 for flying and related activities (e.g., taking off and landing). As another example, the sensors 434 may include a gyroscope that is used by the propulsion subsystem 412 to control pitch, roll, and/or yaw. An accelerometer may be used by the propulsion subsystem 412 as part of its avionics logic. A global positioning system (GPS) sensor may be used by the propulsion subsystem 412 to control flight according to routes and also by other subsystems, such as by the one or more processors 402 for calculation of routes (e.g., by obtaining a current location and calculating an optimal route to a specified destination). The digital compass 424 may be used by the propulsion subsystem 412 to control direction. A set of proximity sensors (e.g., using acoustic proximity detectors) may be used by the propulsion subsystem 412 for the purpose of obstacle avoidance and accurate navigation (e.g., during a delivery). Some sensors may be used to gather environmental data, such as audio, video, digital images, and the like. Other environmental data may be related to the weather and, accordingly, the sensors 434 may include sensors that gather weather data, such as wind speed, barometric pressure, humidity, visibility, and the like. The sensors listed are examples and, generally, the specific sensors that are used on an unmanned aerial vehicle may vary in accordance with the tasks that the unmanned aerial vehicle performs.

The digital compass 424 can be configured and can operate in a similar manner to the digital compass 300 described above with respect to FIG. 3. The digital compass 424 can be configured and can be operate in a similar manner as described in the embodiments of FIGS. 1-2. As described herein, the heading calculator 430 can calculate a heading and the offset error detector 124 can detect an offset error and report an offset error, such as when the offset error satisfies a threshold criterion (e.g., the multi-axis magnetic sensors do not match or a difference between measurements of the multi-axis magnetic sensors exceeds a threshold value).

Figure 5A:
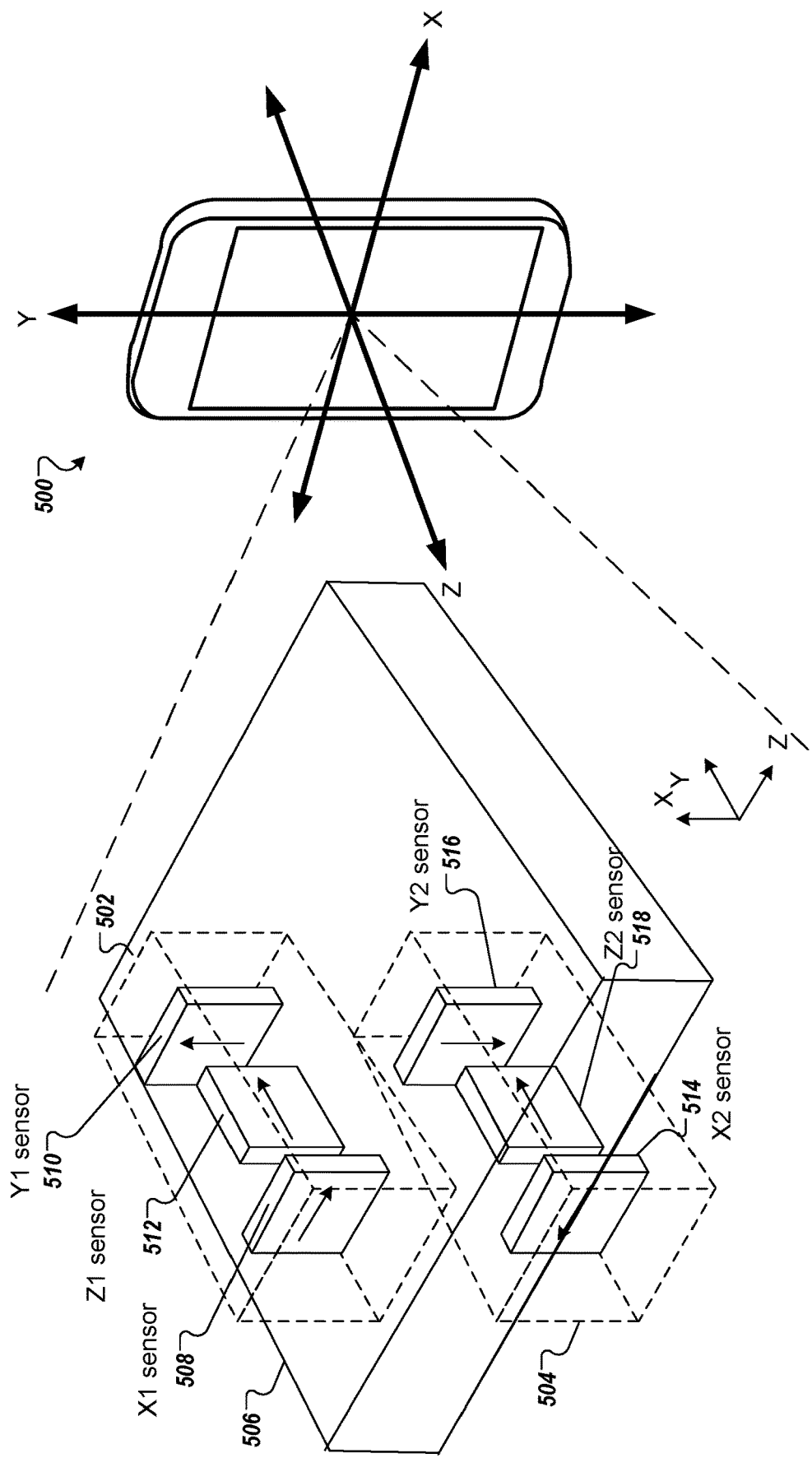
FIG. 5A is a diagram illustrating two three-axis magnetic field sensors disposed on opposing sides of a circuit board of a mobile device according to one embodiment.

FIG. 5A is a diagram illustrating two three-axis magnetic field sensors disposed on opposing sides of a circuit board of a mobile device 500 according to one embodiment. The mobile device 500 includes a first three-axis magnetic field sensor 502 and a second three-axis magnetic field sensor 505. The first three-axis magnetic field sensor 502 is disposed on a first side of a circuit board 506 at a first location. The three-axis magnetic field sensor 504 is disposed on a second side of the circuit board 506 at a second location. In one embodiment, the first location and the second location can be separated by at least one 1 cm. In other embodiments, the first location and the second location can be on a same side of the circuit board 506. The first three-axis magnetic field sensor 502 includes a first sensor 508 disposed in a first axis (e.g., X sensor in an X axis), a second sensor 510 disposed in a second axis (e.g., Y sensor in a Y axis), and a third sensor 512 disposed in a third axis (e.g., Z sensor in a Z axis). The first, second, and third axes of the sensors 508-512 correspond to three axes of the mobile device 500 as illustrated in FIG. 5A. Alternatively, the three axes of the sensors are different than the three axes of the mobile device 500. The second three-axis magnetic field sensor 504 includes a first sensor 514 disposed in the first axis (e.g., X2 sensor in the X axis), a second sensor 516 disposed in the second axis (e.g., Y2 sensor in the Y axis), and a third sensor 518 disposed in a third axis (e.g., Z2 sensor in the Z axis). In the depicted embodiment, the sensors of the first three-axis magnetic field sensor 502 are disposed on the same three axes of the second three-axis magnetic field sensor 504. In other embodiments, the sensors of the first three-axis magnetic field sensor 502 are disposed on corresponding offset axes of the second three-axis magnetic field sensor 504, such as illustrated in three offset sensors in FIG. 5B.

Figure 5B:
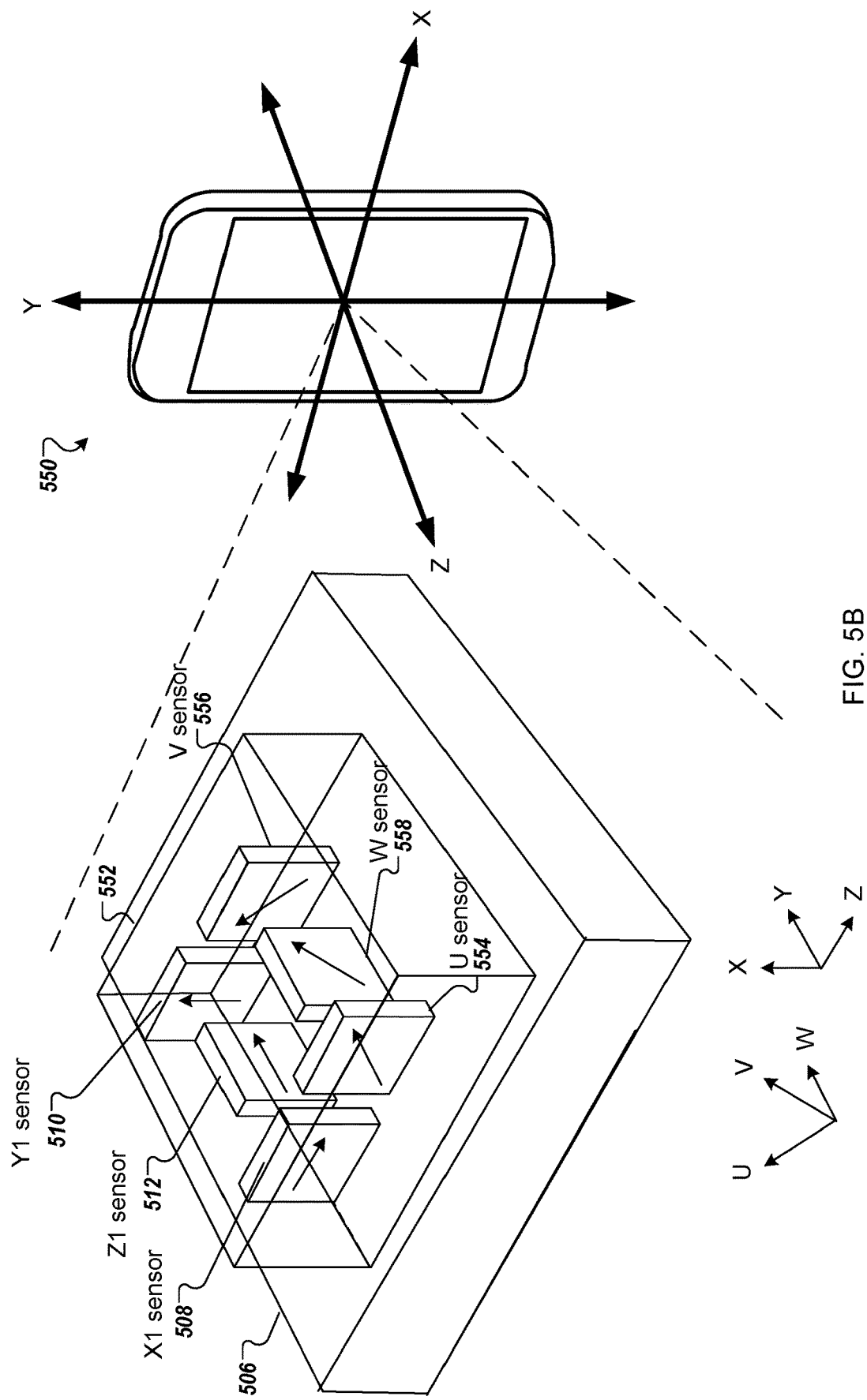
FIG. 5B is a diagram illustrating a six-axis magnetic field sensor disposed on a circuit board of a mobile device according to one embodiment.

FIG. 5B is a diagram illustrating a six-axis magnetic field sensor disposed on a circuit board of a mobile device 550 according to one embodiment. The mobile device 550 includes a single six-axis magnetic field sensor 552. The single six-axis magnetic field sensor 552 is disposed on the first side of the circuit board 506 at a first location. Instead of a second three-axis magnetic field sensor 504 being disposed on a second side of the circuit board 506 at a second location, the single six-axis magnetic field sensor 552 includes an additional three sensors. The single six-axis magnetic field sensor 552 includes the first sensor 508 disposed in the first axis (e.g., X sensor in the X axis), the second sensor 510 disposed in the second axis (e.g., Y sensor in the Y axis), and the third sensor 512 disposed in the third axis (e.g., Z sensor in the Z axis) as described above with respect to the FIG. 5A. As described above, the first, second, and third axes of the sensors 508-512 correspond to three axes of the mobile device 550 as illustrated in FIG. 5B. Alternatively, the three axes of the sensors are different than the three axes of the mobile device 550. In addition, the single six-axis magnetic field sensor 552 includes a fourth sensor 554 disposed in a fourth axis (e.g., U sensor in a W axis that is offset from the X-axis), a fifth sensor 556 disposed in a fifth axis (e.g., V sensor in a V axis that is offset from the Y axis), and a sixth sensor 558 disposed in a sixth axis (e.g., W sensor in a W axis that is offset from the Z axis). As depicted, three sensors of the single six-axis magnetic field sensor 552 are disposed on corresponding offset axes from the other three sensors of the single six-axis magnetic field sensor 552.

Figure 6A:
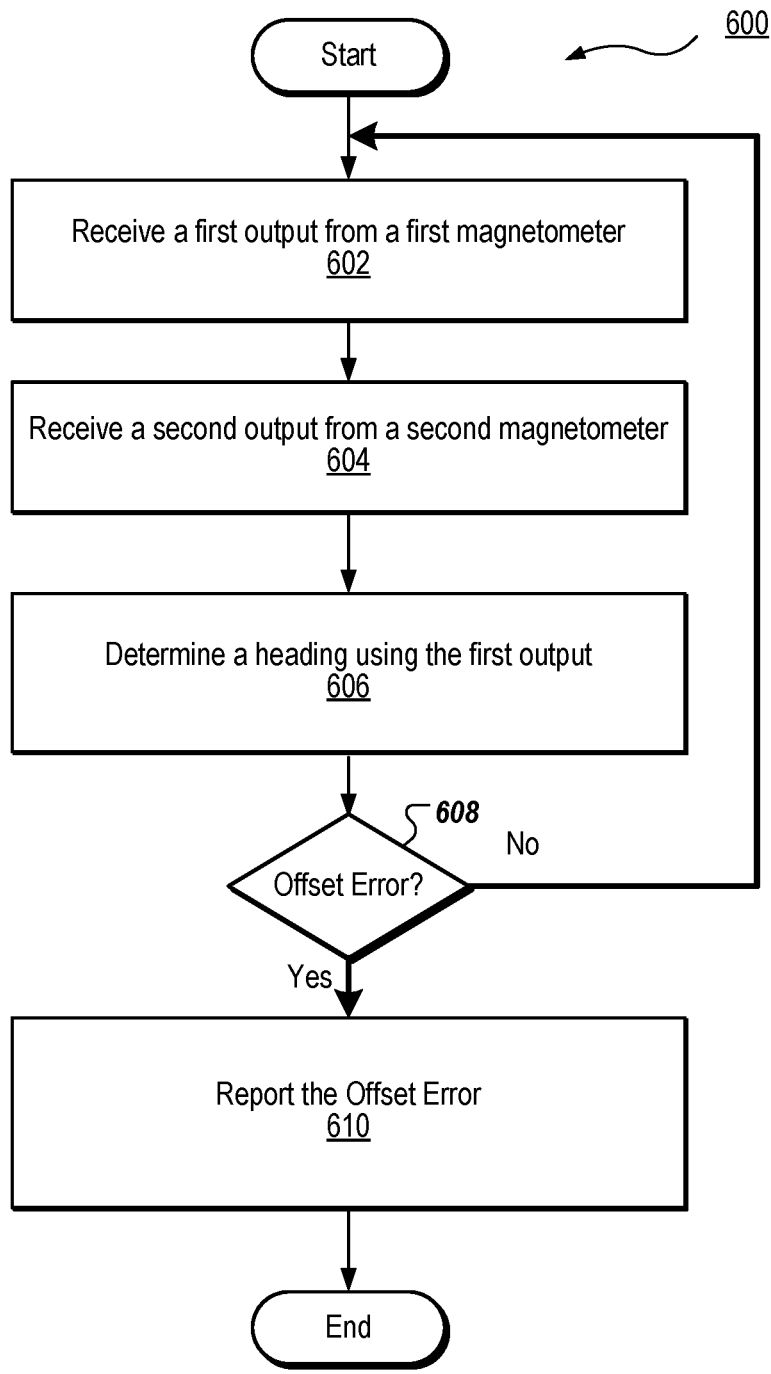
FIG. 6A is a flow diagram of a method of detecting an offset error between two magnetometers according to one embodiment.

FIG. 6A is a flow diagram of a method 600 of detecting an offset error between two magnetometers according to one embodiment. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the processing device 120 of FIG. 1 or FIG. 2. In another embodiment, the method 600 is performed by the processing element 320 of FIG. 3. In another embodiment, the method 600 is performed by the offset error detector 124 of FIG. 1-4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring to FIG. 6A, the method 600 begins by the processing logic receiving a first output from a first magnetometer (block 602) and receiving a second output from a second magnetometer (block 604). At block 606, the processing logic determines a heading of the electronic device using the first output from the first magnetometer. At block 608, the processing logic determines where there is an offset error in the heading using the second output from the second magnetometer. If the offset error is detected at block 608, the processing logic reports the offset error in the heading (block 610) and the method 600 ends. If the offset error is detected at block 608, the processing logic can return to block 602.

In a further embodiment, the processing logic determines the heading of the electronic device using at least one of the first output or the second output. The processing logic determines a difference between the first output and the second output. The processing logic detects the offset error in the heading using the difference.

In a further embodiment, the processing logic determines the heading of the electronic device using at least one of the first output, the second output, or a third output from a third magnetometer. The processing logic detects the offset error in the heading using at least a first difference between the first output and the second output, a second difference between the first output and the third output, or a third difference between the second output and the third output. The processing logic determines a local magnetic field introduced by a magnetic source in proximity to the first magnetometer, the second magnetometer, and the third magnetometer. The processing logic calculates an offset for at least one of the first magnetometer, the second magnetometer, and the third magnetometer and applies the offset to the at least one of the first magnetometer, the second magnetometer, and the third magnetometer. The processing logic determines an updated heading of the electronic device subsequent to the offset being applied.

In another embodiment, the processing logic determines a heading of an electronic device using a first output from a first magnetometer. The processing logic detects an offset error in the heading using a second output from a second magnetometer having at least one at least an additional magnetic field sensor in a fourth axis that is non-orthogonal axis to a first axis, a second axis, and a third axis of the first magnetometer. The processing logic reports the offset error in the heading.

In a further embodiment, the processing logic determines the heading of the electronic device using the first output and the second output, determines a difference between the first output and the second output. The processing logic detects the offset error in the heading using the difference.

In a further embodiment, the processing logic determines the heading of the electronic device using the first output and the second output, determines a difference between the first output and the second output. The processing logic detects the offset error in the heading using the difference.

In a further embodiment, the processing logic determines the heading of the electronic device using at least one of the first output, the second output, or a third output from the third magnetometer as described above.

Figure 6B:
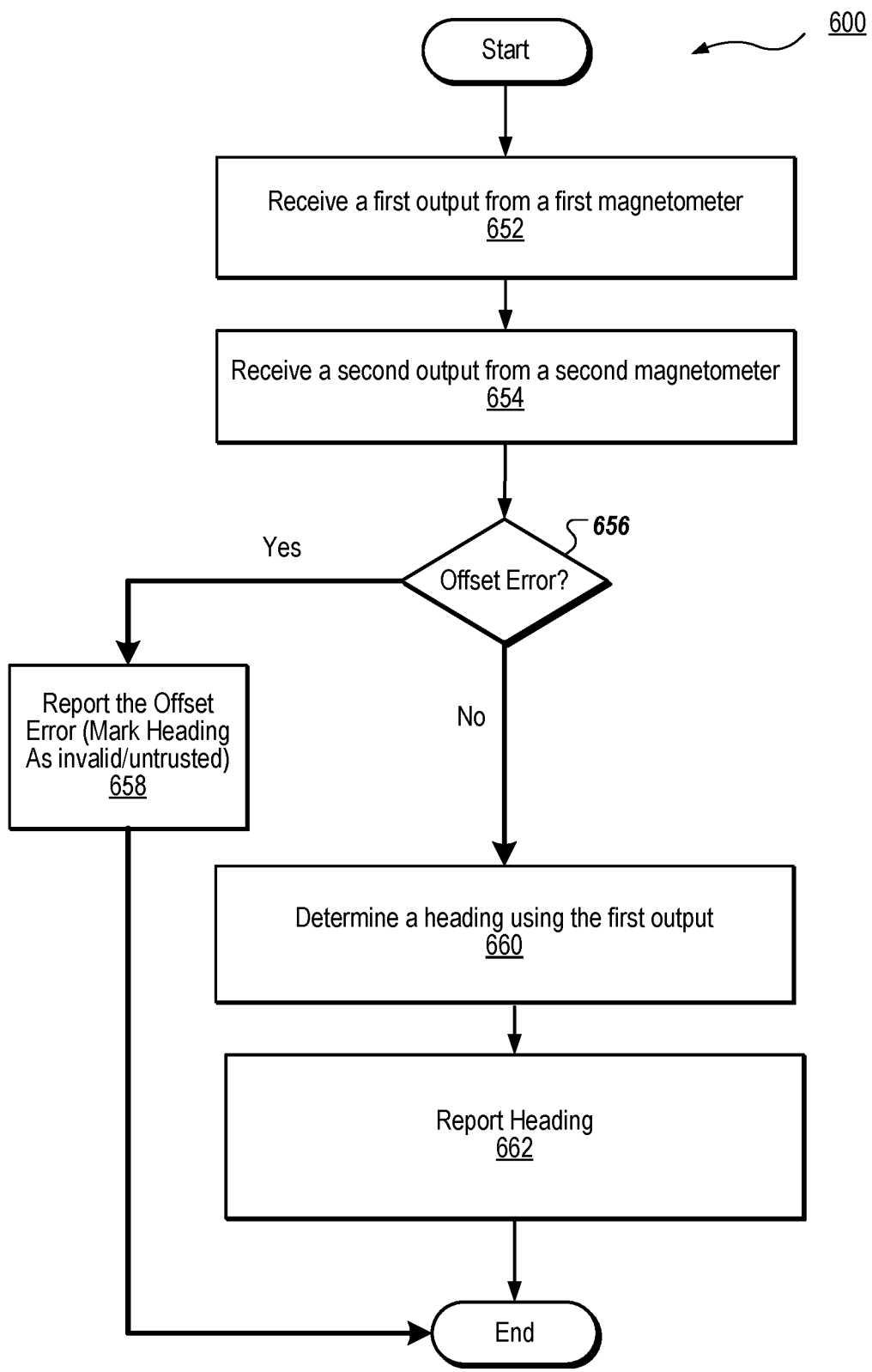
FIG. 6B is a flow diagram of a method of detecting an offset error between two magnetometers according to another embodiment.

FIG. 6B is a flow diagram of a method 650 of detecting an offset error between two magnetometers according to another embodiment. The method 650 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 650 is performed by the processing device 120 of FIG. 1 or FIG. 2. In another embodiment, the method 650 is performed by the processing element 320 of FIG. 3. In another embodiment, the method 650 is performed by the offset error detector 124 of FIG. 1-4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring to FIG. 6B, the method 650 begins by the processing logic receiving a first output from a first magnetometer (block 652) and receiving a second output from a second magnetometer (block 654). The first output is indicative of a magnetic field in at least one axis and the second output is indicative of magnetic field in the at least one axis. At block 656, the processing logic determines where there is an offset error between the first output and the second output. If the offset error is not detected at block 656, the processing logic determines a heading using the first output, the second output, or both (block 660) and the processing logic reports the heading (block 662). In some cases, the processing logic can use GPS information to figure out which of the first output or second output is the correct heading. If the offset error is detected at block 656, the processing logic reports the offset error (block 658) and the method 650 ends. For example, the processing logic can mark a heading as invalid or set a bit (or other indicator) that the first output and the second output are untrusted or invalid. In some cases, the invalid heading is reported to a display. In other cases, the heading is not displayed. In other cases, the device does not include a display and the heading or the invalid heading is not displayed but input into another subsystem.

In some embodiments, the processing logic can determine at which sensor is likely to be correct using additional information. For example, using GPS data, the processing logic can determine the device's location on earth and then use a mathematical model as a reasonable estimate of the local strength and declination of the earth's magnetic field at that location. If one sensor has an offset but the other does not, the unaffected sensor will have a vector magnitude that is closer to the model. This can be enhanced if the processing logic knows the gravitational orientation of the magnetometer axes, and then the processing logic can look for the correct declination. It should be noted that this process can be used to select the affected sensor instead of comparing the output of the sensors at block 656. Also, the processing logic could use this process with a single sensor to determine if the single sensor has an offset. It has more corner cases and false positives than the dual sensor approach, especially in handheld devices. This process could be implemented in software of devices that now only use a single sensor.

Figure 7:
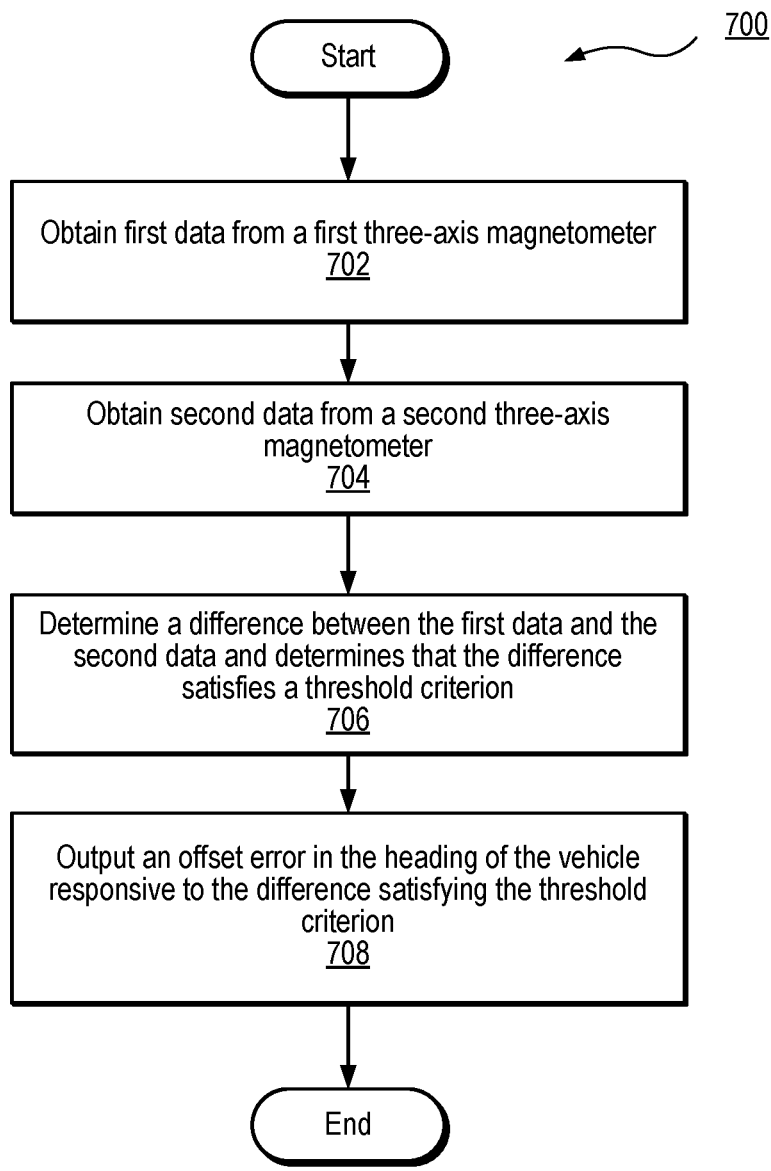
FIG. 7 is a flow diagram of a method of operating a digital compass with two magnetometers with an offset error detector according to another embodiment.

FIG. 7 is a flow diagram of a method 700 of operating a digital compass with two magnetometers with an offset error detector according to one embodiment. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the processing device 120 of FIG. 1 or FIG. 2. In another embodiment, the method 700 is performed by the processing element 320 of FIG. 3. In another embodiment, the method 700 is performed by the offset error detector 124 of FIG. 1-4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring to FIG. 7, the method 700 begins by the processing logic obtaining first data from a first three-axis magnetometer (block 702). The first data is indicative of a heading of a vehicle. At block 704, the processing logic obtains second data from a second three-axis magnetometer. The second data can also be indicative of the heading of the vehicle. At block 706, the processing logic determines a difference between the first data and the second data and determines that the difference satisfies a threshold criterion. The threshold criterion corresponds to detecting an offset error in the heading caused by at least one of a permanent offset error or a local temporary offset error in the heading. At block 708, the processing logic outputs an offset error in the heading of the vehicle responsive to the difference satisfying the threshold criterion, and the method 700 ends.

Figure 8:
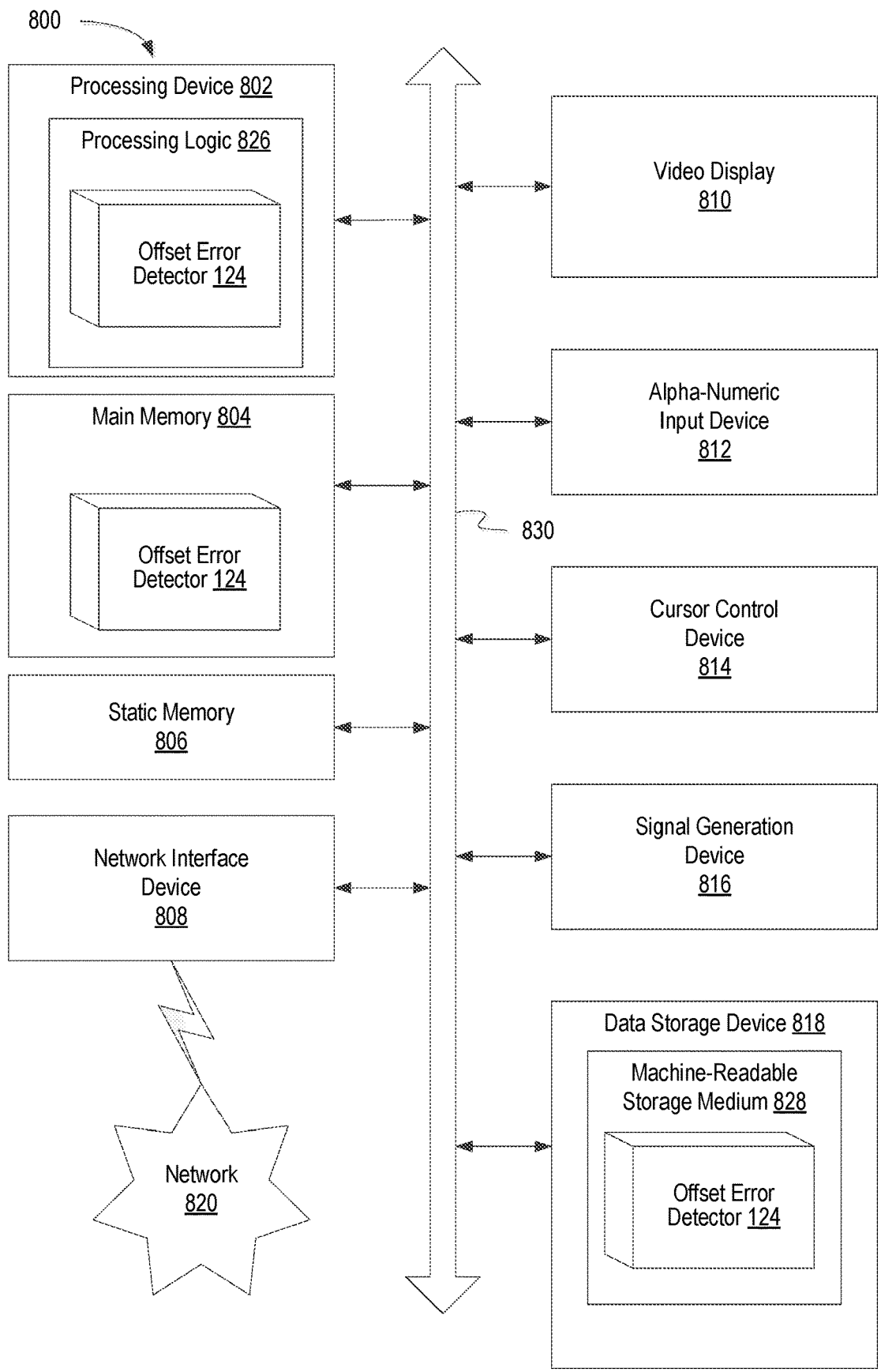
FIG. 8 illustrates a diagrammatic representation of a machine in the example form of a computer system including a set of instructions executable by a computer to detect an offset error in a heading according to any one or more of the methodologies discussed herein.

FIG. 8 illustrates a diagrammatic representation of a machine in the example form of a computer system 800 including a set of instructions executable by a computer to detect an offset error in a heading according to any one or more of the methodologies discussed herein. In one embodiment, the computer may include instructions to enable execution of the processes and corresponding components shown and described in connection with FIGS. 1-7.

In alternative embodiments, the machine may be connected (e.g., networked) to other machines in a LAN, an intranet, an extranet, or the Internet. The machine may operate in the capacity of a server machine in a client-server network environment. The machine may be a personal computer (PC), a set-top box (STB), a server, a network router, switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein The example computer system 800 includes a processing device (processor) 802, a main memory 804 (e.g., read-only memory (ROM), flash memory, dynamic random access memory (DRAM) such as synchronous DRAM (SDRAM)), a static memory 806 (e.g., flash memory, static random access memory (SRAM)), and a data storage device 818, which communicate with each other via a bus 830.

Processing device 802 represents one or more general-purpose processing devices such as a microprocessor, central processing unit, or the like. More particularly, the processing device 802 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 802 may also be one or more special-purpose processing devices such as an application specific integrated circuit (ASIC), a field programmable gate array (FPGA), a digital signal processor (DSP), network processor, or the like. In various implementations of the present disclosure, the processing device 802 is configured to execute instructions for the offset error detector 124 for performing the operations and processes described herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The data storage device 818 may include a computer-readable storage medium 828 (or machine-readable medium) on which is stored one or more sets of instructions of the offset error detector 124 embodying any one or more of the methodologies or functions described herein. The instructions may also reside, completely or at least partially, within the main memory 804 and/or within processing logic 826 of the processing device 802 during execution thereof by the computer system 800, the main memory 804 and the processing device 802 also constituting computer-readable media.

The instructions may further be transmitted or received over a network 820 via the network interface device 808. While the computer-readable storage medium 828 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media, and magnetic media.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely presented as examples. Particular implementations may vary from these example details and still be contemplated to be within the scope of the present disclosure. In the above description, numerous details are set forth.

It will be apparent, however, to one of ordinary skill in the art having the benefit of this disclosure, that embodiments of the disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to the desired result. The steps are those requiring physical manipulations of physical quantities. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "performing", "applying", "determining", "generating", or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments of the disclosure also relate to an apparatus for performing the operations herein. This apparatus may be specially constructed for the required purposes, or it may comprise a general purpose computer selectively activated or reconfigured by a computer program stored in the computer. Such a computer program may be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present disclosure as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A vehicle comprising:
   a delivery container to store a product;
   a circuit board;
   a digital compass comprising:
      a first three-axis magnetometer disposed on the circuit board at a first location; and
      a second three-axis magnetometer disposed on the circuit board at a second location, the second location being a specified distance away from the first location; and
   a processing device disposed on the circuit board and coupled to the digital compass, the processing device to:
      obtain first data from the first three-axis magnetometer, wherein the first data is indicative of a heading of the vehicle;
      obtain second data from the second three-axis magnetometer, wherein the second data is indicative of the heading of the vehicle;
      determine a difference between the first data and the second data;
      determine that the difference satisfies a threshold criterion, wherein the threshold criterion corresponds to detecting an offset error in the heading caused by at least one of a permanent offset error or a local temporary offset error in the heading; and
      output an offset error in the heading of the vehicle responsive to the difference satisfying the threshold criterion.

2. The vehicle of claim 1, wherein the processing device is further to:
   determine the heading from at least one of the first data or the second data;
   output the heading to a display associated with the processing device; and
   prevent the heading from being output to the display or output an indicator that the heading is invalid to the display responsive to the difference satisfying the threshold criterion.

3. The vehicle of claim 1, wherein the first data comprises a first value corresponding to a first axis of the first three-axis magnetometer, a second value corresponding to a second axis of the first three-axis magnetometer, and a third value corresponding to a third axis of the first three-axis magnetometer, wherein the second data comprises a fourth value corresponding to a first axis of the second three-axis magnetometer, a fifth value corresponding to a second axis of the second three-axis magnetometer, and a sixth value corresponding to a third axis of the second three-axis magnetometer, wherein the processing device, to determine the difference between the first data and the second data, compares the first value and the fourth value, the second value and the fifth value, and the third value and the sixth value.

4. The vehicle of claim 1, wherein the first data comprises a first digital heading value and the second data comprises a second digital heading value.

5. An electronic device comprising:
   a first magnetometer comprising a first magnetic field sensor corresponding to a first axis of the electronic device;
   a second magnetometer comprising a second magnetic field sensor corresponding to the first axis, wherein the second magnetometer is disposed at least a specified minimum distance away from the first magnetometer; and
   a processing device coupled to the first magnetometer and the second magnetometer, wherein the processing device is to:
      determine a magnetic field at the electronic device using a first output from the first magnetometer;
      determine an offset error in the magnetic field using a difference between the first output from the first magnetometer and a second output from the second magnetometer;
      determine that the difference satisfies a threshold criterion, wherein the threshold criterion corresponds to detecting the offset error in a heading of a vehicle caused by at least one of a permanent offset error or a local temporary offset error in the heading; and
      report the offset error in the magnetic field responsive to the difference satisfying the threshold criterion.

6. The electronic device of claim 5, wherein the first magnetometer further comprises a third magnetic field sensor corresponding to a second axis of the electronic device and a fourth magnetic field sensor corresponding to a third axis of the electronic device, wherein the first axis, the second axis, and the third axis are orthogonal, wherein the first output is indicative of a heading of the electronic device in three-dimensional space, and wherein the second magnetometer further comprises a fifth magnetic field sensor corresponding to the second axis and a sixth magnetic field sensor corresponding to the third axis.

7. The electronic device of claim 6, wherein the processing device is further to:
   determine the heading of the electronic device using at least one of the first output or the second output.

8. The electronic device of claim 6, further comprising:
   a third magnetometer comprising a seventh magnetic field sensor corresponding to the first axis, an eighth magnetic field sensor corresponding to the second axis, and a ninth magnetic field sensor corresponding to the third axis, wherein the third magnetometer is disposed at least the specified minimum distance from the first magnetometer and at least the specified minimum distance from the second magnetometer, wherein the processing device is coupled to the third magnetometer and is further to:
      determine the heading of the electronic device using at least one of the first output, the second output, or a third output from the third magnetometer;
      detect the offset error in the heading using at least a first difference between the first output and the second output, a second difference between the first output and the third output, or a third difference between the second output and the third output; and
      determine a local magnetic field introduced by a magnetic source in proximity to the first magnetometer, the second magnetometer, and the third magnetometer; and
      calculate an offset for at least one of the first magnetometer, the second magnetometer, and the third magnetometer;
      apply the offset to the at least one of the first magnetometer, the second magnetometer, and the third magnetometer; and
      determine an updated heading of the electronic device subsequent to the offset being applied.

9. The electronic device of claim 5, further comprising:
   a digital compass comprising the first magnetometer and the second magnetometer, and wherein the digital compass is coupled to the processing device via a wired interconnect;
   a propulsion subsystem coupled to the wired interconnect;
   a wireless communication subsystem coupled to the wired interconnect; and
   an additional sensor coupled to the wired interconnect, wherein the electronic device is integrated in a vehicle.

10. The electronic device of claim 9, wherein the vehicle is a drone.

11. The electronic device of claim 5, further comprising a digital compass comprising the first magnetometer and the second magnetometer, wherein the electronic device is integrated in an aerial vehicle.

12. The electronic device of claim 5, further comprising a digital compass comprising the first magnetometer and the second magnetometer, wherein the electronic device is integrated in a ground vehicle.

13. A vehicle comprising:
   a delivery container to store a product;
   a circuit board;
   a digital compass comprising:
      a first magnetometer comprising a first magnetic field sensor corresponding to a first axis of the vehicle; and
      a second magnetometer comprising a second magnetic field sensor corresponding to a second axis of the vehicle, wherein the second magnetometer is disposed at least a specified minimum distance away from the first magnetometer; and
   a processing device coupled to the first magnetometer and the second magnetometer, wherein the processing device is to:
      determine a magnetic field at the vehicle using a first output from the first magnetometer;
      determine an offset error in the magnetic field using a difference between the first output from the first magnetometer and a second output from the second magnetometer;
      determine that the difference satisfies a threshold criterion, wherein the threshold criterion corresponds to detecting the offset error in a heading of the vehicle caused by at least one of a permanent offset error or a local temporary offset error in the heading; and report the offset error in the magnetic field responsive to the difference satisfying the threshold criterion.

14. The vehicle of claim 13, wherein the processing device is further to:

determine the heading of the vehicle from at least one of the first output or the second output;

output the heading to a display associated with the processing device; and prevent the heading from being output to the display or output an indicator that the heading is invalid to the display, responsive to the difference satisfying the threshold criterion.

15. The vehicle of claim 13, wherein the first magnetometer further comprises a third magnetic field sensor corresponding to a third axis of the vehicle, wherein the second magnetometer further comprises a fourth magnetic field sensor corresponding to a fourth axis of the vehicle.

16. The vehicle of claim 15, wherein the first output comprises a first value corresponding to the first axis of the first magnetic field sensor and a third value corresponding to the third axis of the third magnetic field sensor, wherein the second output comprises a second value corresponding to the second axis of the second magnetic field sensor and a fourth value corresponding to the fourth axis of the fourth magnetic field sensor, wherein the processing device, to determine the offset error in the magnetic field, compares the first value and the second value, and the third value and the fourth value.

17. The vehicle of claim 15, wherein the first magnetometer further comprises a fifth magnetic field sensor corresponding to a fifth axis of the vehicle, wherein the second magnetometer further comprises a sixth magnetic field sensor corresponding to a sixth axis of the vehicle.

18. The vehicle of claim 17, wherein the first output comprises a first value corresponding to the first axis of the first magnetic field sensor, a third value corresponding to the third axis of the third magnetic field sensor, and a fifth value corresponding to the fifth axis of the fifth magnetic field sensor, wherein the second output comprises a second value corresponding to the second axis of the second magnetic field sensor, a fourth value corresponding to the fourth axis of the fourth magnetic field sensor, and a sixth value corresponding to the sixth axis of the sixth magnetic field sensor, wherein the processing device, to determine the offset error in the magnetic field, compares the first value and the second value, the third value and the fourth value, and the fifth value and the sixth value.

19. The vehicle of claim 13, wherein the first output comprises a first digital heading value and the second output comprises a second digital heading value.

* * * * *